US012744093B2

(12) United States Patent
Choi

(10) Patent No.: US 12,744,093 B2
(45) Date of Patent: Sep. 22, 2026

(54) SEMICONDUCTOR DEVICE FOR PERFORMING A PROGRAM OPERATION AND A METHOD OF OPERATING THE SEMICONDUCTOR DEVICE

(71) Applicant: SK hynix Inc., Icheon-si (KR)

(72) Inventor: Hyung Jin Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 597 days.

(21) Appl. No.: 18/310,965

(22) Filed: May 2, 2023

(65) Prior Publication Data

US 2024/0170079 A1 May 23, 2024

(30) Foreign Application Priority Data

Nov. 22, 2022 (KR) ........................ 10-2022-0157550

(51) Int. Cl.
*G11C 16/10* (2006.01)
*G11C 16/04* (2006.01)
*G11C 16/24* (2006.01)
*G11C 16/34* (2006.01)

(52) U.S. Cl.
CPC ...... *G11C 16/3459* (2013.01); *G11C 16/0433* (2013.01); *G11C 16/102* (2013.01); *G11C 16/24* (2013.01)

(58) Field of Classification Search
CPC ............ G11C 16/3459; G11C 16/0433; G11C 16/102; G11C 16/24
USPC ..................................................... 365/185.22
See application file for complete search history.

(56) References Cited

U.S. PATENT DOCUMENTS 11,282,583 B2* 3/2022 Kim ........................ G11C 16/10
2022/0215870 A1* 7/2022 Jung ................... G11C 11/2259
2022/0215889 A1* 7/2022 Lim .................... G11C 16/0483
2022/0383927 A1* 12/2022 Jung ................... G11C 11/2255
2023/0292523 A1* 9/2023 Song ..................... G11C 11/223

FOREIGN PATENT DOCUMENTS

KR 1020090120673 A 11/2009
KR 1020200050762 A 5/2020
KR 1020220079227 A 6/2022

* cited by examiner

*Primary Examiner* — Min Huang
(74) *Attorney, Agent, or Firm* — WILLIAM PARK AND ASSOCIATES LTD.

(57) ABSTRACT

Provided herein is a semiconductor device and a method of operating the semiconductor device. The semiconductor device includes a memory block, a peripheral circuit, and control logic. The memory block includes a plurality of memory cells. The peripheral circuit is configured to perform a program operation on a memory cell selected from among the plurality of memory cells. The control logic is configured to control the peripheral circuit to allow a common source line coupled to the memory block to float in a sensing phase included in a verify phase of the program operation, and thereafter apply a first voltage, higher than a ground voltage, to the floating common source line.

22 Claims, 11 Drawing Sheets

100
110
BLKz
BLKc
BLKb
BLKa
BL1
BL2
BLm
PB1
PB2
PBm
130
DATA
120
ADDRESS DECODER
WLs
150
VOLTAGE GENERATOR
VPGM, Vvf
CTRLAD
CTRLPB
CTRLVG
140
CONTROL LOGIC
CMD
ST
PG
DSL
WLn
WL6
WL5
WL4
WL3
WL2
WL1
SSL
CSL
DST
MCn
MC6
MC5
MC4
MC3
MC2
MC1
SST
BL1
BL2
BL3
BL4
BL5
BLm

SEMICONDUCTOR DEVICE FOR PERFORMING A PROGRAM OPERATION AND A METHOD OF OPERATING THE SEMICONDUCTOR DEVICE

CROSS-REFERENCE TO RELATED APPLICATION

The present application claims priority under 35 U.S.C. § 119(a) to Korean patent application number 10-2022-0157550 filed on Nov. 22, 2022, in the Korean Intellectual Property Office, the entire disclosure of which is incorporated by reference herein.

BACKGROUND

1. Technical Field

Various embodiments of the present disclosure generally relate to an electronic device, and more particularly to a semiconductor device for performing a program operation and a method of operating the semiconductor device.

2. Related Art

A semiconductor memory device may have a two-dimensional (2D) structure in which strings are horizontally arranged on a semiconductor substrate. Alternatively, the semiconductor memory device may have a three-dimensional (3D) structure in which strings are vertically stacked on a semiconductor substrate. As a memory device having a 2D structure is reaching its physical scaling limit (i.e., limit in the degree of integration), a 3D memory device including a plurality of memory cells vertically stacked on a semiconductor substrate has been produced. A program operation of the semiconductor memory device may include a plurality of program loops, each including a program voltage apply phase and a verify phase. Meanwhile, the verify phase may include a bit line precharge phase, an evaluation phase, and a sensing phase.

SUMMARY

An embodiment of the present disclosure may provide for a semiconductor device. The semiconductor device may include a memory block, a peripheral circuit, and control logic. The memory block includes a plurality of memory cells. The peripheral circuit may be configured to perform a program operation on a memory cell selected from among the plurality of memory cells. The control logic may be configured to control the peripheral circuit to allow a common source line coupled to the memory block to float in a sensing phase included in a verify phase of the program operation, and thereafter apply a first voltage, higher than a ground voltage, to the floating common source line.

An embodiment of the present disclosure may provide for a method of operating a semiconductor device. The method may include precharging voltages of bit lines coupled to a memory block including memory cells selected as a program target, among a plurality of memory cells, applying a verify voltage to a selected word line coupled to the selected memory cells, among word lines coupled to the memory block, and applying a verify pass voltage to an unselected word line other than the selected word line, among the word lines, and storing data, indicating whether each of the selected memory cells is turned on, in a latch based on respective voltages of the bit lines. Storing the data, indicating whether each of the selected memory cells is turned on, in the latch may include allowing a common source line coupled to the memory block to float, and applying a first voltage, higher than a ground voltage, to the floating common source line.

An embodiment of the present disclosure may provide for a method of operating a semiconductor device. The method may include precharging voltages of bit lines coupled to a memory block including memory cells selected as a program target, among a plurality of memory cells, applying a verify voltage to a selected word line coupled to the selected memory cells, among word lines coupled to the memory block, and apply a verify pass voltage to an unselected word line other than the selected word line, among the word lines, storing data, indicating whether each of the selected memory cells is turned on, in a latch based on respective voltages of the bit lines, and applying a program pass voltage to the unselected word line and applying a program voltage to the selected word line. Storing the data, indicating whether each of the selected memory cells is turned on, in the latch may include allowing a common source line coupled to the memory block to float. Applying the program pass voltage to the unselected word line and applying the program voltage to the selected word line may include applying a first voltage, higher than a ground voltage, to the floating common source line.

DETAILED DESCRIPTION

Specific structural or functional descriptions in the embodiments of the present disclosure introduced in this specification or application are provided as examples to describe embodiments according to the concept of the present disclosure. The embodiments according to the concept of the present disclosure may be practiced in various forms, and should not be construed as being limited to the embodiments described in the specification or application. The word "preset" as used herein with respect to a parameter, such as a preset precharge voltage, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Various embodiments of the present disclosure are directed to a semiconductor device that is capable of reducing power consumption occurring during a program operation on memory cells and a method of operating the semiconductor device.

Figure 1:
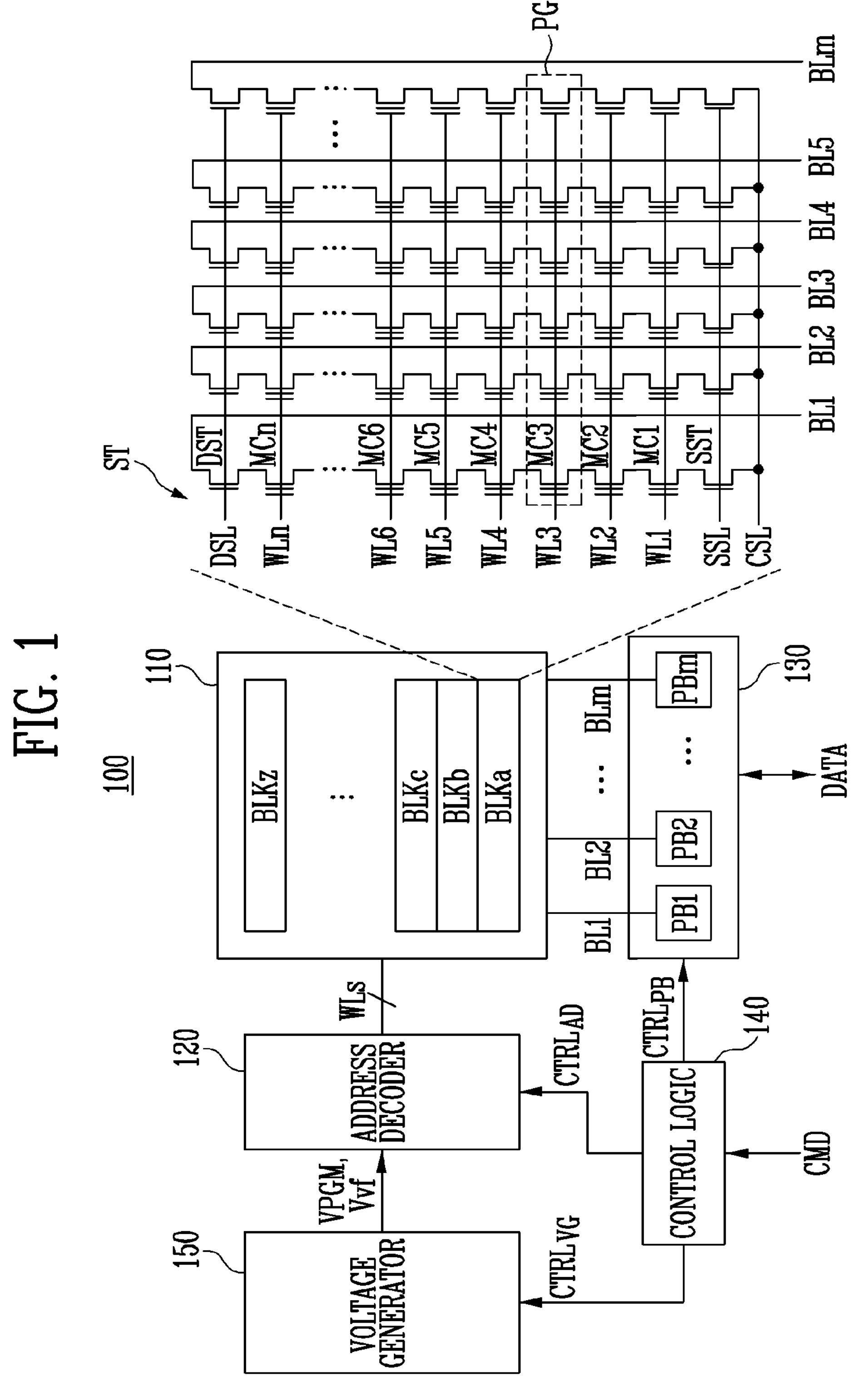
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, a semiconductor memory device 100 may include a memory cell array 110, an address decoder 120, a read and write circuit 130, control logic 140, and a voltage generator 150. The control logic 140 may be implemented as hardware, software, or a combination of hardware and software. For example, the control logic 140 may be a control logic circuit operating in accordance with an algorithm and/or a processor executing control logic code.

The memory cell array 110 may include a plurality of memory blocks BLKa to BLKz. The memory blocks BLKa to BLKz are coupled to the address decoder 120 through word lines WLs. The memory blocks BLKa to BLKz are coupled to the read and write circuit 130 through bit lines BL1 to BLm. Each of the memory blocks BLKa to BLKz may include a plurality of memory cells. In an embodiment, the plurality of memory cells may be nonvolatile memory cells, and may be implemented as nonvolatile memory cells having a vertical channel structure.

In FIG. 1, the structure of the memory block BLKa, among the plurality of memory blocks BLKa to BLKz included in the memory cell array, is illustrated. Referring to FIG. 1, a plurality of word lines WL1 to WLn arranged in parallel to each other may be coupled between a drain select line DSL and a source select line SSL. More specifically, the memory block BLKa may include a plurality of strings ST coupled between bit lines BL1 to BLm and a common source line CSL. The bit lines BL1 to BLm may be coupled to the corresponding strings ST, respectively, and the common source line CSL may be coupled in common to the strings ST. Because the strings ST may be equally configured, the string ST coupled to the first bit line BL1 will be described in detail by way of example.

The string ST may include a source select transistor SST, a plurality of memory cells MC1 to MCn, and a drain select transistor DST which are coupled in series to each other between the source line SL and the first bit line BL1. At least one source select transistor SST and at least one drain select transistor DST may be included in one string ST.

A source of the source select transistor SST may be coupled to the common source line CSL, and a drain of the drain select transistor DST may be coupled to the first bit line BL1. The memory cells MC1 to MCn may be coupled in series between the source select transistor SST and the drain select transistor DST. Gates of the source select transistors SST included in different strings ST may be coupled to the source select line SSL, gates of the drain select transistors DST included in different strings ST may be coupled to the drain select line DSL, and gates of the memory cells MC1 to MCn may be coupled to a plurality of word lines WL1 to WLn, respectively. A group of memory cells coupled to the same word line, among the memory cells included in different strings ST, may be referred to as a 'physical page (PG)'. Therefore, the memory block BLKa may include a number of physical pages (PG) identical to the number of word lines WL1 to WLn.

One memory cell may store one bit of data. This cell is typically designated as a "single-level cell (SLC)." In this case, one physical page (PG) may store data of one logical page (LPG). The data of one logical page (LPG) may include a number of data bits identical to the number of cells included in one physical page (PG).

Meanwhile, one memory cell may store two or more bits of data. In this case, one physical page (PG) may store data of two or more logical pages (LPG).

Although, in FIG. 1, the structure of a two-dimensional (2D) memory block is illustrated, the present disclosure is not limited thereto. That is, each of the memory blocks BLKa to BLKz of FIG. 1 may also be implemented as a three-dimensional (3D) memory block.

The address decoder 120, the read and write circuit 130, and the voltage generator 150 are operated as a peripheral circuit for driving the memory cell array 110. The peripheral circuit may perform a read operation, a write operation, and an erase operation on the memory cell array 110 under the control of the control logic 140. The address decoder 120 is coupled to the memory cell array 110 through the word lines WLs. The address decoder 120 may be operated under the control of the control logic 140. In detail, the control logic 140 may transfer an address decoding control signal $CTRL_{AD}$ to the address decoder 120, and the address decoder 120 may perform a decoding operation in response to the address decoding control signal $CTRL_{AD}$.

Further, the address decoder 120 may apply a program voltage VPGM generated by the voltage generator 150 to a selected word line and apply a program pass voltage to the remaining word lines, that is, unselected word lines, during a program operation. Further, the address decoder 120 may apply a verify voltage Vvf generated by the voltage generator 150 to the selected word line and apply a verify pass voltage to the remaining word lines, that is, unselected word lines during a verify operation.

The read and write circuit 130 includes a plurality of page buffers PB1 to PBm. The read and write circuit 130 may be operated as a "read circuit" during a read operation on the memory cell array 110 and as a "write circuit" during a write operation on the memory cell array 110. The plurality of page buffers PB1 to PBm may be coupled to the memory cell array 110 through the bit lines BL1 to BLm. The read and write circuit 130 performs a program operation on the received data DATA in response to a page buffer control signal $CTRL_{PB}$ output from the control logic 140.

The control logic 140 is coupled to the address decoder 120, the read and write circuit 130, and the voltage generator 150. The control logic 140 may receive a command CMD from an external device. The control logic 140 may control the address decoder 120, the read and write circuit 130, and the voltage generator 150 to perform an operation corresponding to the received command CMD. That is, the control logic 140 may control the operation of the voltage generator 150 using a voltage generation control signal $CTRL_{VG}$. Also, the control logic 140 may control the operation of the address decoder 120 using the address decoding control signal $CTRL_{AD}$. Meanwhile, the control logic 140 may control the operations of the page buffers PB1 to PBm in the read and write circuit 130 in response to a page buffer control signal $CTRL_{PB}$.

The voltage generator 150 may generate a read voltage Vread and a pass voltage Vpass during a read operation in response to a voltage generation control signal $CTRL_{VG}$ output from the control logic 140. The voltage generator 150 may generate various operating voltages. For example, the voltage generator 150 may generate the program voltage VPGM used for a program operation and a verify voltage Vvf used for a program verify voltage. Further, the voltage generator 150 may also generate a program pass voltage and a verify pass voltage.

The program operation may be performed on a page basis. Memory cells coupled in common to one word line may form a physical page. In an embodiment, the physical page may include one or more logical pages. Therefore, page data indicating data stored in the physical page may include data of one or more logical pages. For example, when each memory cell is programmed in an SLC mode, the physical page may include one logical page, and page data may include data of one logical page. Alternatively, when the memory cell is programmed in an MLC mode, the physical page may include two logical pages, and page data may include data of two logical pages. Here, the data of two logical pages may be least significant bit (LSB) page data and most significant bit (MSB) page data. Alternatively, when the memory cell is programmed in a TLC mode, the physical page may include three logical pages, and page data may include data of three logical pages. Here, the data of three logical pages may be least significant bit (LSB) page data, central significant bit (CSB) page data, and most significant bit (MSB) page data.

The program operation may include a plurality of program loops. For example, the program operation may start by performing a first program loop ($1^{st}$ PGM Loop), and may perform a second program loop ($2^{nd}$ PGM Loop) when the program operation is not yet completed even if the first program loop ($1^{st}$ PGM Loop) has been performed. When the program operation is not yet completed even if the second program loop ($2^{nd}$ PGM Loop) has been performed, a third program loop ($3^{rd}$ PGM Loop) may be performed. In this way, the program loops may be repeatedly performed until the program operation is completed. Meanwhile, when the program operation is not completed even if a number of program loops identical to the preset maximum number of program loops have been repeated, it may be determined that the program operation has failed.

Meanwhile, the program operation of the semiconductor memory device may be performed using an incremental step pulse programming (ISPP) scheme. The ISPP scheme may be a scheme for programming memory cells while gradually increasing a program voltage. As the number of program loops that are performed is repeated, a program voltage applied in each program loop may gradually increase.

Each program loop may include a program step (PGM Phase) and a verify step (Verify Phase). In the program phase, a program voltage may be applied to a selected word line, and thus the threshold voltages of memory cells in a program-enable state may increase. In the verify phase, whether memory cells selected as a program target have been programmed to a verify voltage having a desired level or more may be verified. As a result of the verify operation, a memory cell which is not programmed to the verify voltage or more may be operated as a program-enabled cell in a subsequent program loop. Here, a program voltage having a voltage level higher than that in a previous program loop may be applied to the program-enabled cells. Meanwhile, a memory cell which is programmed to the verify voltage or more may be operated as a program-inhibited cell in a subsequent program loop. Even if the program voltage is applied to the selected word line, the threshold voltage of the program-inhibited cell might not increase.

Figure 2:
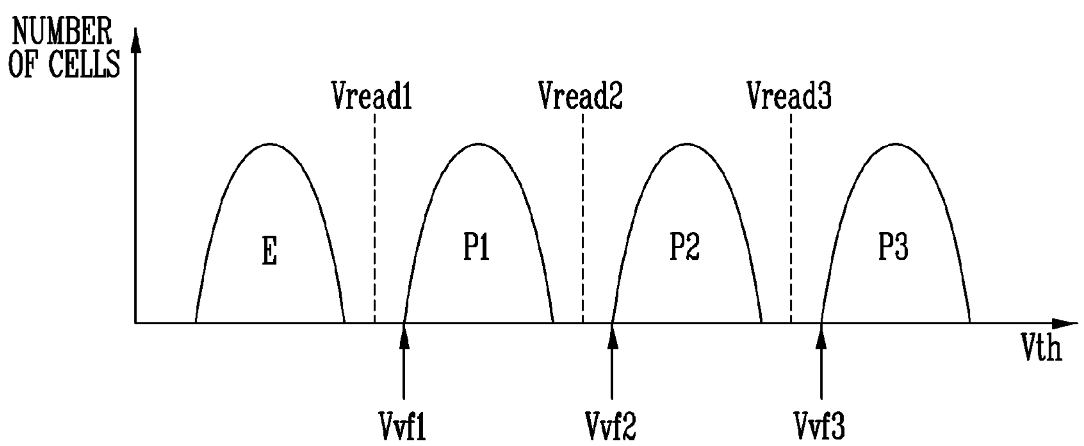
FIG. 2 is a diagram for explaining threshold voltage distributions of multi-level cells (MLC) and verify voltages for forming the threshold voltage distributions.

FIG. 2 is a diagram for explaining threshold voltage distributions of multi-level cells (MLC) and verify voltages for forming the threshold voltage distributions.

Referring to FIG. 2, threshold voltage distributions in target states corresponding to multi-level cells are illustrated by way of example. Each multi-level cell (MLC) may store two bits of data, and may then be programmed to belong to any one of a total of four target states. More specifically, the target states may include an erase state E, a first program state P1, a second program state P2, and a third program state P3.

In order to read data from the multi-level cell (MLC), first to third read voltages Vread1 to Vread3 may be used. Meanwhile, during a program verify operation, verify voltages Vvf1, Vvf2, and Vvf3 may be used. In an example, a program-enable voltage is applied to bit lines coupled to memory cells having threshold voltages lower than the first verify voltage Vvf1, among the memory cells to be programmed to the first program state P1. In an embodiment, the program-enable voltage may be a ground voltage. Further, a program-inhibit voltage is applied to bit lines coupled to memory cells having threshold voltages higher than the first verify voltage Vvf1. The program-inhibit voltage is a voltage higher than the program-enable voltage.

While a program voltage is applied to the selected word line, the threshold voltages of memory cells coupled to the bit lines to which the program-inhibit voltage is applied are maintained. Meanwhile, the threshold voltages of memory cells coupled to the bit lines to which the program-enable voltage is applied are increased while the program voltage is applied to the selected word line.

In the above description, although the first program state P1 is described as an example, a program operation for the second and third program states P2 and P3 may be performed in the same manner as the first program state P1.

Hereinafter, a semiconductor memory device and the operation thereof according to the present disclosure will be described based on a program operation performed on a multi-level cell (MLC) for convenience of description. However, the present disclosure is not limited thereto, and may also be applied to a program operation on a single-level cell (SLC), a triple-level cell (TLC), or the like.

Figure 3A:
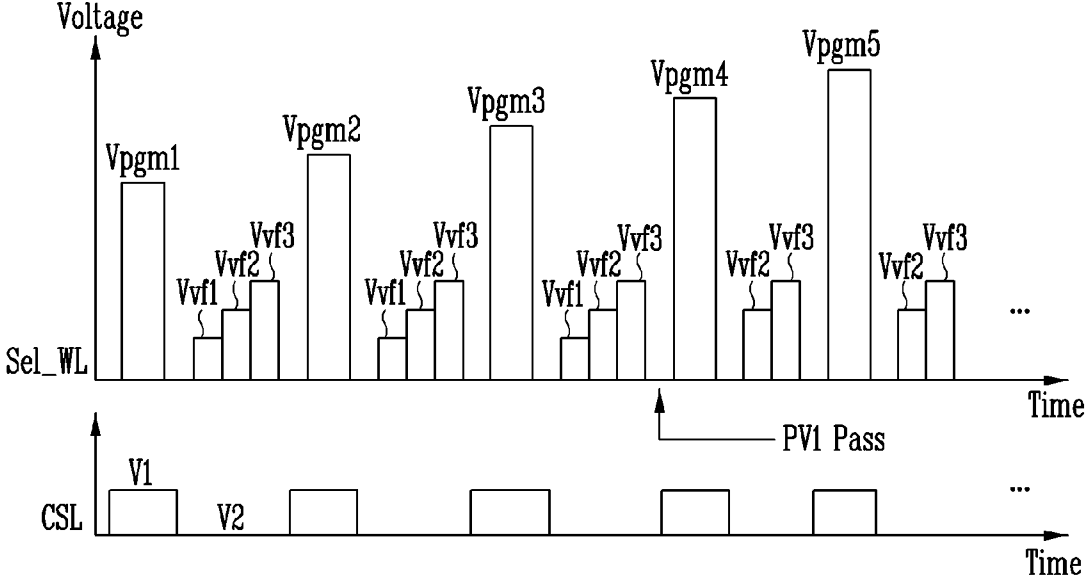
FIGS. 3A and 3B are diagrams for explaining voltages of a selected word line and a common source line during a program operation.
Figure 3B:
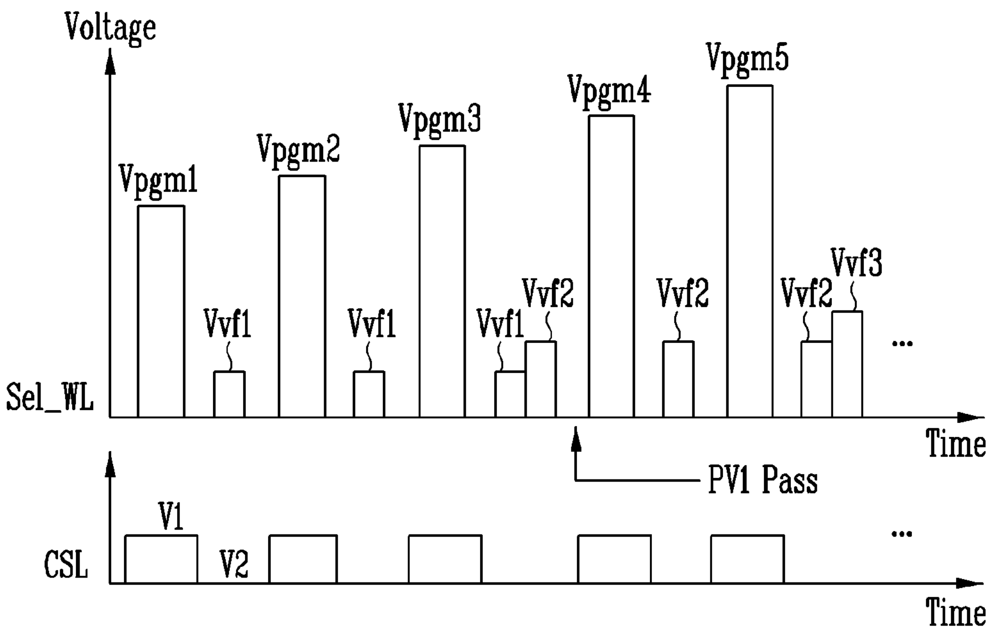

FIGS. 3A and 3B are diagrams for explaining voltages of a selected word line and a common source line during a program operation. Referring to FIGS. 3A and 3B, a program operation for forming the program states of FIG. 2 may include a plurality of program loops.

Referring to FIG. 3A, in a program phase of a first program loop, a first program voltage Vpgm1 is applied to a selected word line Sel_WL. In this case, a channel voltage may be boosted, wherein a first voltage V1 may be applied to a common source line CSL to maintain the boosted channel voltage. The first voltage may be a voltage higher than a ground voltage. In an embodiment, the first voltage V1 may be a supply voltage.

Further, in a verify phase of the first program loop, first to third verify voltages Vvf1 to Vvf3 may be sequentially applied to the selected word line. In order to allow a cell current to flow during bit line evaluation, a second voltage V2 lower than the first voltage V1 may be applied to the common source line CSL while the first to third verify voltages Vvf1 to Vvf3 are applied to the selected word line. In an embodiment, the second voltage V2 may be the ground voltage.

Thereafter, in a program phase of a second program loop, a second program voltage Vpgm2 may be applied to the selected word line, and in a verify phase, the first to third verify voltages Vvf1 to Vvf3 may be applied to the selected word line.

Thereafter, in a program phase of a third program loop, a third program voltage Vpgm3 may be applied to the selected word line. Further, in a verify phase of the third program loop, the first to third verify voltages Vvf1 to Vvf3 may be applied to the selected word line.

In this way, in each program loop performed during the program operation of the semiconductor memory device, the first voltage V1 may be applied to the common source line in the program phase (PGM Phase), and the second voltage V2, lower than the first voltage V1, may be applied to the common source line in the verify phase.

Referring to FIG. 3A, it is illustrated that, as a result of performing the verify phase of the third program loop, verification for the first program state P1 has passed. Therefore, in subsequent program loops, the first verify voltage Vvf1 might not be used. Accordingly, in a program phase of a fourth program loop, a fourth program voltage Vpgm4 may be applied to the selected word line, and in a verify phase, the second and third verify voltages Vvf2 and Vvf3 may be applied to the selected word line. This process may be repeated until verification for the second and third program states P2 and P3 is completed.

Referring to FIG. 3A, an embodiment in which one or more verify voltages are applied to the selected word line in the order in which the verify voltages are sequentially increased from a low voltage to a high voltage is illustrated. However, this is only an example, and the present disclosure is not limited thereto. For example, a plurality of verify voltages may be applied to the selected word line in the order in which the verify voltages are sequentially decreased from a high voltage to a low voltage.

In an initial stage of the program operation, memory cells programmed to second and third program states might not be present. Accordingly, in the first program loop ($1^{st}$ PGM Loop), a verify operation may be performed using only the first verify voltage Vvf1. Referring to FIG. 3B, in a program phase of a first program loop, a first program voltage Vpgm1 is applied to a selected word line. In order to maintain the boosted channel voltage while the first program voltage Vpgm1 is applied to the selected word line, the first voltage V1 is applied to the common source line CSL. In an embodiment, the first voltage V1 may be a supply voltage.

Further, in a verify phase of the first program loop, the first verify voltage Vvf1 may be applied to the selected word line. The second voltage V2, lower than the first voltage V1, may be applied to the common source line CSL while the first verify voltage Vvf1 is applied to the selected word line. In an embodiment, the second voltage V2 may be the ground voltage.

Thereafter, in a program phase of a second program loop, a second program voltage Vpgm2 may be applied to the selected word line, and in a verify phase, the first verify voltage Vvf1 may be applied to the selected word line.

Thereafter, in a program phase of a third program loop, a third program voltage Vpgm3 may be applied to the selected word line. Further, in a verify phase of the third program loop, the first and second verify voltages Vvf1 and Vvf2 may be applied to the selected word line.

Referring to FIG. 3B, it is illustrated that, as a result of performing the verify phase in the third program loop, verification for the first program state P1 has passed. Therefore, in subsequent program loops, the first verify voltage Vvf1 might not be used. Accordingly, in a program phase of a fourth program loop, a fourth program voltage Vpgm4 may be applied to the selected word line, and in a verify phase, the second verify voltage Vvf2 may be applied to the selected word line.

Thereafter, in a program phase of a fifth program loop, a fifth program voltage Vpgm5 may be applied to the selected word line. Further, in a verify phase of the fifth program loop, the second and third verify voltages Vvf2 and Vvf3 may be applied to the selected word line. In this way, the program loops may be repeatedly performed until verification for a second program state P2 and a third program state P3 passes. This process may be repeated until verification for the second and third program states P2 and P3 is completed.

According to the embodiment illustrated in FIG. 3B, because verification for the second and third program states P2 and P3 is not performed in an initial program loop, the overall program speed may be improved.

Figure 4:
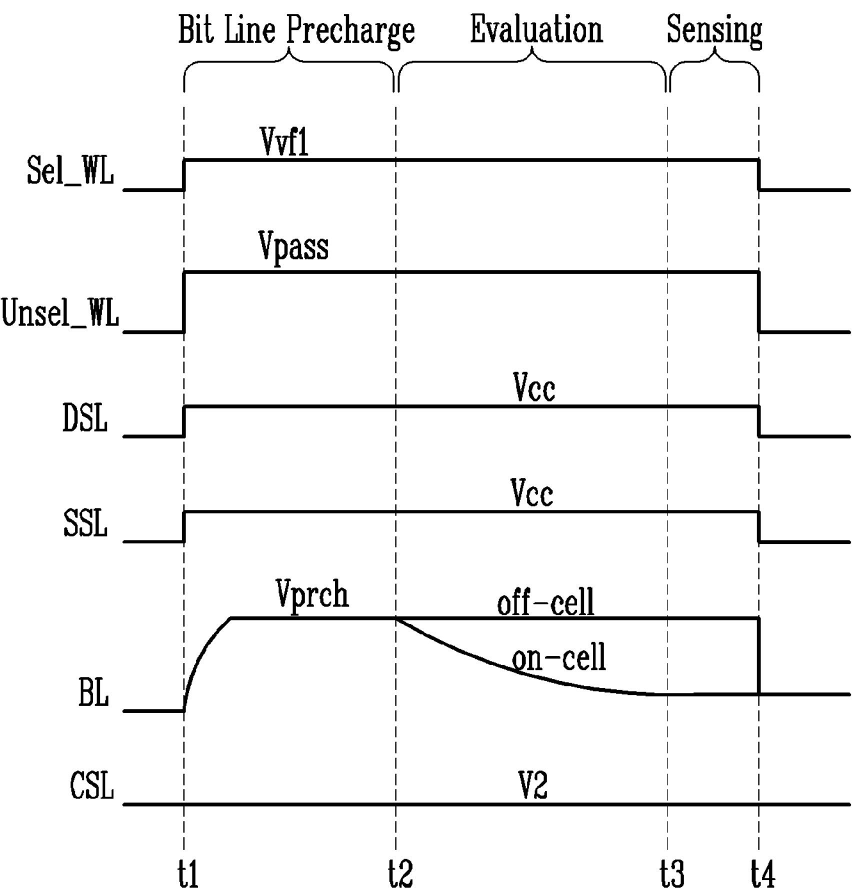
FIG. 4 is a timing diagram illustrating a method of operating a semiconductor memory device according to an embodiment of the present disclosure.

FIG. 4 is a timing diagram illustrating a method of operating a semiconductor memory device according to an embodiment of the present disclosure. More specifically, FIG. 4 illustrates a verify phase of each program loop performed by the semiconductor memory device.

Referring to FIG. 4, the verify phase may include a bit line precharge phase, an evaluation phase, and a sensing phase. The verify phase may be an operation of sensing, using at least one verify voltage, results indicating whether the threshold voltages of memory cells selected as a program target are higher than the verify voltage or lower than the verify voltage, and storing the results of sensing in latches provided in a page buffer. As described above with reference to FIG. 3B, the verify phase may be performed at least once depending on the progress of the program operation. For example, in the first program loop of FIG. 3B, the verify phase is performed once. In this case, the verify phase using the first verify voltage Vvf1 is performed. Meanwhile, in the third program loop of FIG. 3B, the verify phase is performed twice. In this case, the verify phase using the first verify voltage Vvf1 and the second verify voltage Vvf2 is performed.

The bit line precharge phase may be the step of increasing the voltage of a bit line coupled to memory cells selected as a verify target to a precharge voltage. The evaluation phase may be the step of evaluating respective threshold voltages of the selected memory cells. For example, in the evaluation phase, a bit line coupled to memory cells having threshold voltages higher than the verify voltage, that is, off-cells, among the selected memory cells, may be maintained at a precharge voltage. On the other hand, in the evaluation phase, the voltage of a bit line coupled to memory cells having threshold voltages lower than the verify voltage, that is, on-cells, among the selected memory cells, may be decreased. Therefore, the voltages of bit lines may be distinguished from each other depending on the threshold voltages of respective memory cells. The sensing phase may be the step of storing bit data, indicating whether each of the selected memory cells is an on-cell or an off-cell, in latches provided in a page buffer based on the voltages of the bit lines distinguished as described above.

As described above with reference to FIGS. 3A and 3B, the second voltage V2 may be applied to the common source line coupled to the memory block during a bit line precharge period, an evaluation period, and a sensing period. The reason for this is that, in the evaluation phase, the voltage of the common source line needs to be maintained at a relatively low voltage to distinguish bit line voltages from each other depending on the threshold voltages of respective memory cells. In an embodiment, the second voltage V2 may be a ground voltage. Therefore, during the entire period of the verify phase including the evaluation phase, the voltage of the common source line may be maintained at the ground voltage.

Referring to FIG. 4 in detail, the voltages of a selected word line Sel_WL, an unselected word line Unsel_WL, a drain select line DSL, a source select line SSL, a bit line BL, and a common source line CSL which are applied during the verify operation of the semiconductor memory device are illustrated. In FIG. 4, a verify phase using the first verify voltage Vvf1 is illustrated by way of example.

At time t1, a bit line precharge phase may start. At time t1, the first verify voltage Vvf1 may be applied to the selected word line Sel_WL, and the pass voltage Vpass may be applied to the unselected word line Unsel_WL. The pass voltage Vpass may be a voltage higher than the first verify voltage Vvf1, and may be a voltage that enables all of the memory cells included in a selected memory block to be turned on, regardless of respective threshold voltages of the corresponding memory cells. Therefore, all of the memory cells coupled to the unselected word line Unsel_WL may remain turned on from time t1.

Meanwhile, as the first verify voltage Vvf1 is applied to the selected word line Sel_WL, memory cells having threshold voltages lower than the first verify voltage Vvf1, among the memory cells coupled to the selected word line Sel_WL, may be turned on, and memory cells having threshold voltages higher than the first verify voltage Vvf1, among the memory cells coupled to the selected word line Sel_WL, may be turned off.

When the bit line precharge phase starts, the voltage of the bit line BL may start to increase at time t1. The voltage of the bit line BL may increase to a precharge voltage Vprch.

Meanwhile, at time t1, a supply voltage Vcc may be applied to a drain select line DSL and a source select line SSL. The supply voltage Vcc may be a voltage that enables a drain select transistor DST and a source select transistor SST to be turned on. As the drain select transistor DST and the source select transistor SST are turned on, the cell strings included in the selected memory block are coupled to the common source line CSL and the corresponding bit lines BL. Because the voltages of the bit lines are increased up to the precharge voltage Vprch, different currents may flow through the cell strings depending on whether cells coupled to the corresponding bit line BL, among the selected memory cells, are on-cells or off-cells. For example, a relatively large current flows through a bit line BL coupled to a cell string including an on-cell and a relatively small current may flow through a bit line coupled to a cell string including an off-cell.

At time t2, the bit line precharge phase may be terminated, and the evaluation phase may start. At time t2, the voltage of a sensing node in the page buffer may be determined depending on respective threshold voltage levels of memory cells coupled to the selected word line Sel_WL. Meanwhile, the voltage of the bit line BL may also be changed or maintained depending on respective threshold voltage levels of the memory cells coupled to the selected word line Sel_WL.

In the timing diagram illustrated in FIG. 4, although an embodiment in which the first verify voltage Vvf1 is applied to the selected word line Sel_WL and the pass voltage Vpass is applied to the unselected word line Unsel_WL from the bit line precharge phase is illustrated, the present disclosure is not limited thereto. That is, the ground voltage may be selected word line Sel_WL and the unselected word line Unsel_WL in the bit line precharge phase, and the first verify voltage Vvf1 may be applied to the selected word line Sel_WL and the pass voltage Vpass may be applied to the unselected word line Unsel_WL in the evaluation phase.

Among the memory cells coupled to the selected word line Sel_WL, memory cells having threshold voltages higher than the first verify voltage Vvf1 may be off-cells. Accordingly, because one of memory cells included in the corresponding cell string is an off-cell, the magnitude of current flowing between the common source line CSL and the bit line BL may be relatively small. Therefore, bit lines coupled to the turned-off cells, that is, off-cells, may be maintained at the precharge voltage Vprch.

Meanwhile, among the memory cells coupled to the selected word line Sel_WL, memory cells having threshold voltages lower than the first verify voltage Vvf1 may be on-cells. Accordingly, because all of memory cells included in the corresponding cell string are turned on, the magnitude of current flowing between the common source line CSL and the bit line BL may be relatively large. Therefore, the voltage of the bit line coupled to the turned-on cells, that is, on-cells, may gradually decrease.

At time t3, the evaluation phase may be terminated, and the sensing phase may start. During a period from t3 to t4, the page buffer may sense the voltages of respective bit lines, and may store the results of sensing, as bit data, in latches. Accordingly, the verify phase using the first verify voltage Vvf1 may be completed.

Referring to FIG. 4, a second voltage V2 may be applied to the common source line CSL in the bit line precharge phase, the evaluation phase, and the sensing phase. In an embodiment, the second voltage V2 may be a ground voltage. However, when the voltage of the common source line CSL is maintained at the ground voltage, a problem may arise in that an average current or a peak current flowing through the common source line CSL increases during some periods of the verify phase.

In accordance with the method of operating the semiconductor memory device according to embodiments of the present disclosure, the ground voltage applied to the common source line during some periods of the verify phase may be blocked. That is, during some periods of the verify phase, the voltage of the common source line CSL may float, instead of being maintained at the second voltage V2, for example, the ground voltage. By means of this operation, in an embodiment, a problem in which an average current or a peak current flowing through the common source line CSL increases may be prevented or mitigated. Hereinafter, a method of operating a semiconductor memory device according to an embodiment of the present disclosure will be described in detail with reference to FIGS. 5 to 7.

Figure 5:
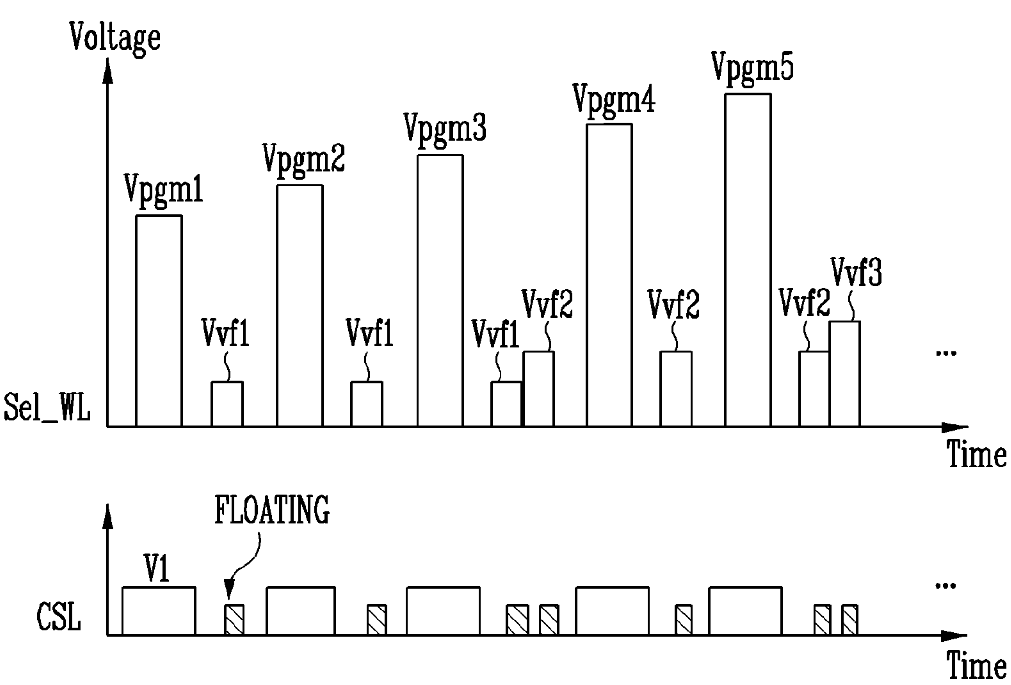
FIG. 5 is a diagram for explaining voltages of a selected word line and a common source line during a program operation according to an embodiment of the present disclosure.

FIG. 5 is a diagram for explaining voltages of a selected word line and a common source line during a program operation according to an embodiment of the present disclosure. In FIG. 5, voltages applied to the selected word line Sel_WL are equal to those illustrated in FIG. 3B. Therefore, repeated descriptions of the voltages applied to the selected word line Sel_WL will be omitted.

Meanwhile, the fact that the first voltage V1 is applied to the common source line CSL in the program phase of each program loop in FIG. 5 is identical to that described in FIG. 3B. However, according to the embodiment illustrated in FIG. 5, during some periods of the verify phase in each program loop, the common source line CSL may float. In FIG. 5 and other drawings, periods during which the common source line CSL is floating are indicated by hatched regions.

In detail, in a verify phase of a first program loop, a first verify voltage Vvf1 may be applied to a selected word line. During at least a partial period of the verify phase using the first verify voltage Vvf1, the common source line CSL may float.

Thereafter, during at least a partial period of a verify phase included in a second program loop, the common source line CSL may float. Further, during a partial period of a verify phase in a third program loop, the common source line CSL may float. In detail, the verify phase of the third program loop may include a verify phase using the first verify voltage Vvf1 and a verify phase using a second verify voltage Vvf2. In accordance with an embodiment of the present disclosure, the common source line CSL may float during at least a partial period of the verify phase using the first verify voltage Vvf1 and at least a partial period of the verify phase using the second verify voltage Vvf2.

In this way, in accordance with the method of operating the semiconductor memory device according to an embodiment of the present disclosure, the common source line CSL may float during at least some periods of the verify phases included in the program operation. Hereinafter, the verify phase in the third program loop will be described in detail with reference to FIG. 6.

Figure 6:
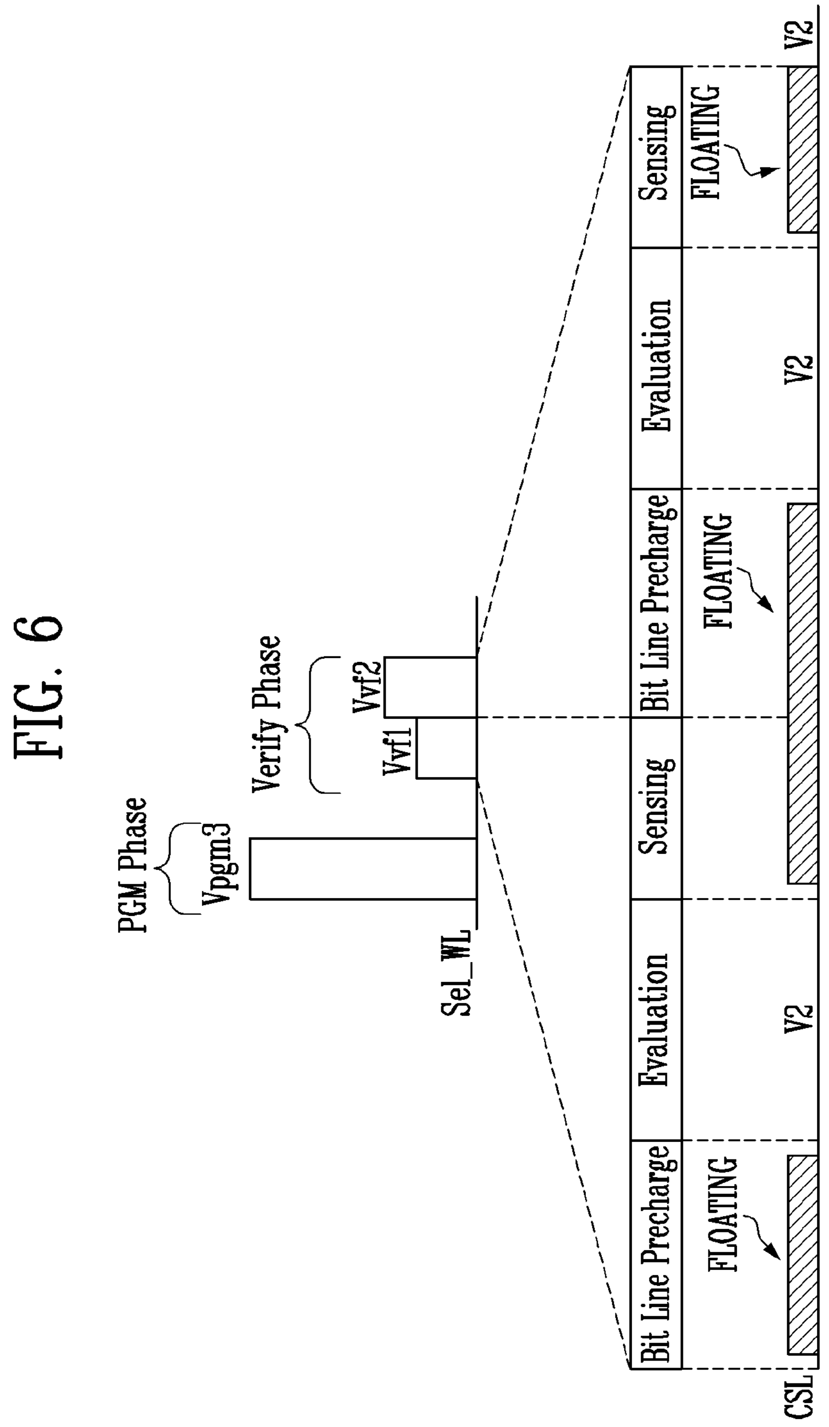
FIG. 6 is a diagram illustrating in brief an embodiment of a verify phase in a third program loop of FIG. 5.

FIG. 6 is a diagram illustrating in brief an embodiment of the verify phase in the third program loop of FIG. 5.

Referring to FIG. 6, the third program loop may include a program phase (PGM Phase) and a verify phase (Verify Phase). In the program phase (PGM Phase), a third program voltage Vpgm3 may be applied to the selected word line Sel_WL. Meanwhile, in the verify phase of the third program loop, a verify operation using the first verify voltage Vvf1 and a verify operation using the second verify voltage Vvf2 may be performed, respectively.

Referring to FIG. 6, a bit line precharge phase, an evaluation phase, and a sensing phase, which are included in the verify operation using the first verify voltage Vvf1, and a bit line precharge phase, an evaluation phase, and a sensing phase, which are included in the verify operation using the second verify voltage Vvf2, are illustrated.

During at least a partial period of the bit line charge phase of the verify operation using the first verify voltage Vvf1, the common source line CSL may float. Also, the common source line CSL may float throughout the sensing phase of the verify operation using the first verify voltage Vvf1 and the bit line precharge phase of the verify operation using the second verify voltage Vvf2. Meanwhile, in the sensing phase of the verify operation using the second verify voltage Vvf2, the common source line CSL may float.

That is, in accordance with other embodiments of the present disclosure, during a plurality of verify operations successively performed in the verify phase included in the program loop, the common source line may float throughout the sensing phase of a previous verify operation and the bit line precharge phase of the current verify operation. In an embodiment, during a plurality of verify operations successively performed in the verify phase included in the program loop, the common source line may float throughout the sensing phase of a previous verify operation and continuously, without break, during the transition into the bit line precharge phase of the current verify operation as shown, for example, in FIG. 6. Accordingly, in an embodiment, the problem in which an average current or a peak current flowing through the common source line CSL increases may be more effectively prevented or mitigated. Consequently, in an embodiment, power consumed in the program operation of the semiconductor memory device 100 may be remarkably reduced.

Figure 7:
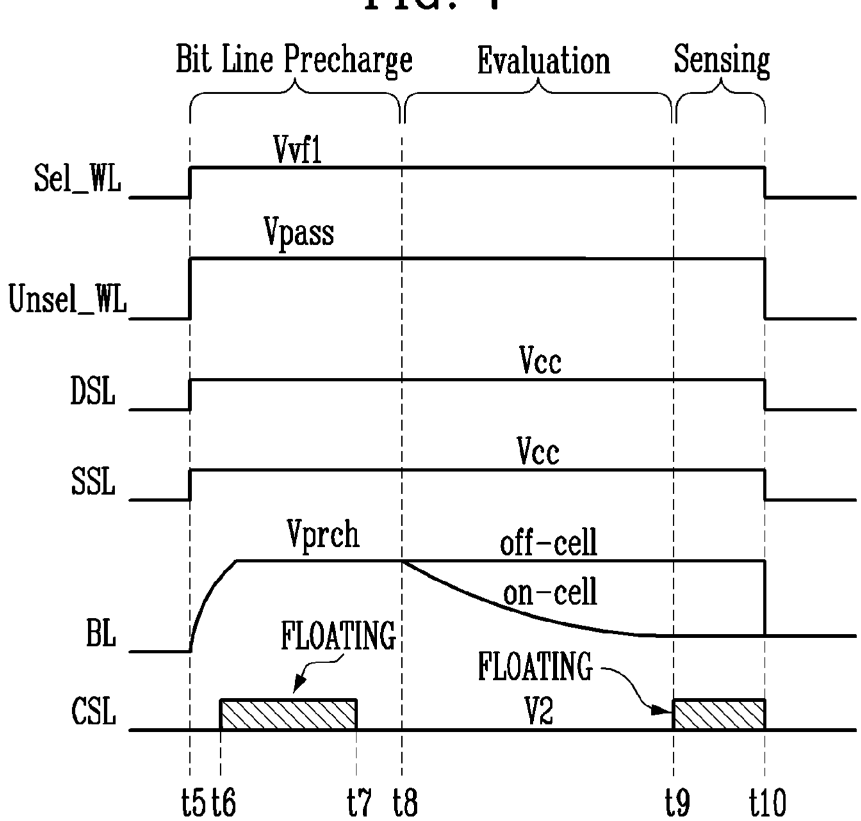
FIG. 7 is a timing diagram illustrating in detail a verify operation using a first verify voltage illustrated in FIG. 6.

FIG. 7 is a timing diagram illustrating in detail the verify operation using the first verify voltage Vvf1 illustrated in FIG. 6.

Referring to FIG. 7, the voltages of a selected word line Sel_WL, an unselected word line Unsel_WL, a drain select line DSL, a source select line SSL, a bit line BL, and a common source line CSL which are applied during a verify operation using the first verify voltage Vvf1 are illustrated as the timing diagram.

At time t5, a bit line precharge phase may start. At time t5, the first verify voltage Vvf1 may be applied to the selected word line Sel_WL, and the pass voltage Vpass may be applied to the unselected word line Unsel_WL. Therefore, all of the memory cells coupled to the unselected word line Unsel_WL may remain turned on from time t5. Further, at time t5, a supply voltage Vcc may be applied to a drain select line DSL and a source select line SSL.

Meanwhile, as the first verify voltage Vvf1 is applied to the selected word line Sel_WL, memory cells having threshold voltages lower than the first verify voltage Vvf1, among the memory cells coupled to the selected word line Sel_WL, may be turned on, and memory cells having threshold voltages higher than the first verify voltage Vvf1, among the memory cells coupled to the selected word line Sel_WL, may be turned off.

When the bit line precharge phase starts, the voltage of the bit line BL may start to increase at time t5. The voltage of the bit line BL may increase up to a precharge voltage Vprch.

Meanwhile, in accordance with the method of operating the semiconductor memory device 100 according to the embodiment of the present disclosure, the common source line CSL may float during at least a partial period of the bit line precharge phase. That is, during a period from t6 to t7, the common source line CSL may float, and a second voltage V2 may be applied to the common source line CSL during the remaining periods.

In the embodiment illustrated in FIG. 7, the case where the common source line CSL is floating only during the partial period from t6 to t7 in the entire period from t5 to t8, corresponding to the bit line precharge phase, is illustrated, but the present disclosure is not limited thereto. The common source line CSL may float during at least any partial period of the entire period from t5 to t8 corresponding to the bit line precharge phase. For example, the common source line CSL may float during the entire period from t5 to t8 corresponding to the bit line precharge phase.

At time t8, the bit line precharge phase may be terminated, and the evaluation phase may start. The evaluation phase illustrated in FIG. 7 may be substantially identical to the evaluation phase illustrated in FIG. 4. Therefore, a repeated description of the evaluation phase will be omitted.

At time t9, the evaluation phase may be terminated, and the sensing phase may start. During a period from t9 to t10, a page buffer may sense the voltages of respective bit lines, and may store the results of sensing, as bit data, in latches. Accordingly, the verify phase using the first verify voltage Vvf1 may be completed.

In accordance with the method of operating the semiconductor memory device 100 according to the embodiment of the present disclosure, the common source line CSL may float during at least a partial period of the sensing phase. That is, the common source line CSL may float during the entire period from time t9 to time t10 or less than all of the period from time t9 to time t10. By means of this operation, in an embodiment, the problem in which an average current or a peak current flowing through the common source line CSL increases may be prevented or mitigated. Consequently, in an embodiment, power consumed in the program operation of the semiconductor memory device 100 may be reduced.

Referring to time t10 of FIG. 7, as the sensing phase is terminated, the second voltage V2 may be applied to the floating common source line CSL. That is, at time t10, a discharge operation on the common source line CSL may be performed. When the voltage of the floating common source line CSL is relatively high just before time t10, a strong current is instantaneously flowing through the common source line CSL due to the discharge operation. Therefore, in an embodiment, at a time point at which the verify phase of the program operation switches to a subsequent program phase, a problem may arise in that an average current or a peak current flowing through the common source line CSL increases.

In accordance with the method of operating the semiconductor memory device 100 according to an embodiment of the present disclosure, the common source line CSL may float during the last sensing operation of the verify phase of each program loop, and the first voltage may be applied to the floating common source line CSL at the time of switching to the program phase of a subsequent program loop. Accordingly, in an embodiment, an operation of unnecessarily discharging the common source line CSL at a time point at which switching from the verify phase of the program operation to the subsequent program phase occurs may be prevented or mitigated. Accordingly, in an embodiment, the problem in which an average current or a peak current flowing through the common source line CSL increases may be prevented or mitigated.

Figure 8:
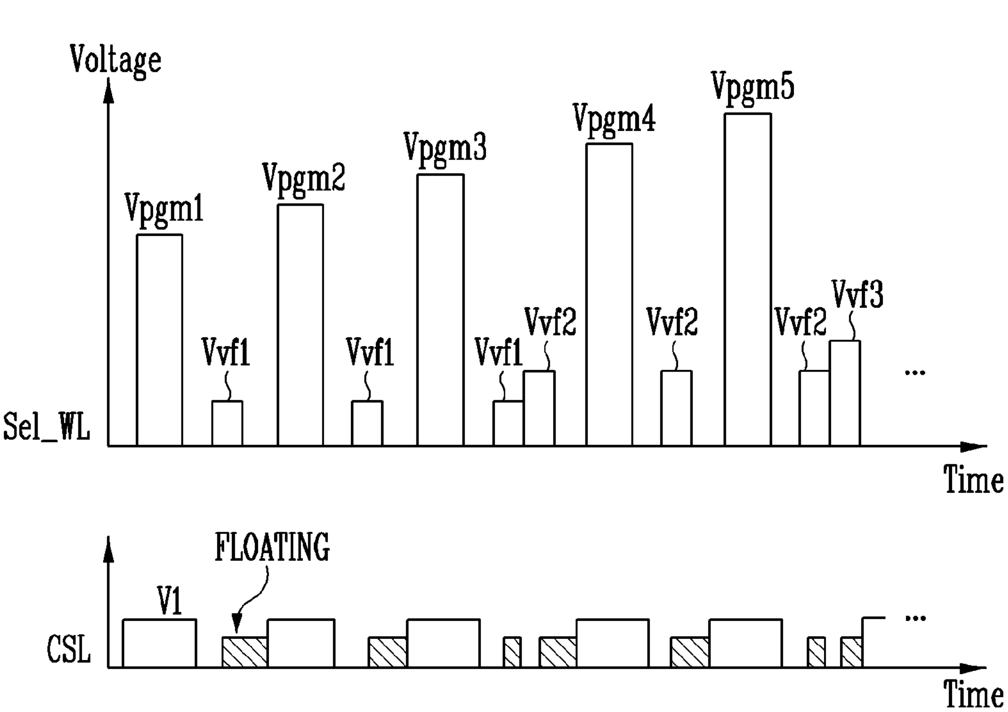
FIG. 8 is a diagram for explaining voltages of a selected word line and a common source line during a program operation according to an embodiment of the present disclosure.

FIG. 8 is a diagram for explaining voltages of a selected word line and a common source line during a program operation according to an embodiment of the present disclosure. In FIG. 8, voltages applied to the selected word line Sel_WL are equal to those illustrated in FIGS. 3B and 5. Therefore, repeated descriptions of the voltages applied to the selected word line Sel_WL will be omitted.

Meanwhile, in FIG. 8, the fact that the first voltage V1 is applied to the common source line CSL in the program phase of each program loop and the common source line CSL floats during at least a partial period of the verify phase of each program loop is also identical to that of FIG. 3B and FIG. 5. However, in accordance with the embodiment illustrated in FIG. 8, during the process of switching from the verify phase of each program loop to the program phase of a subsequent program loop, the floating common source line CSL is not discharged to the second voltage V2. In other words, during the process of switching from the verify phase of each program loop to the program phase of a subsequent program loop, the first voltage V1 is immediately applied in the state in which the common source line CSL is floating. Accordingly, in an embodiment, an operation of unnecessarily discharging the common source line CSL at the time point at which switching from the verify phase of the program operation to the subsequent program phase occurs may be prevented or mitigated. Accordingly, in an embodiment, the problem in which an average current or a peak current flowing through the common source line CSL increases may be prevented or mitigated.

Figure 9:
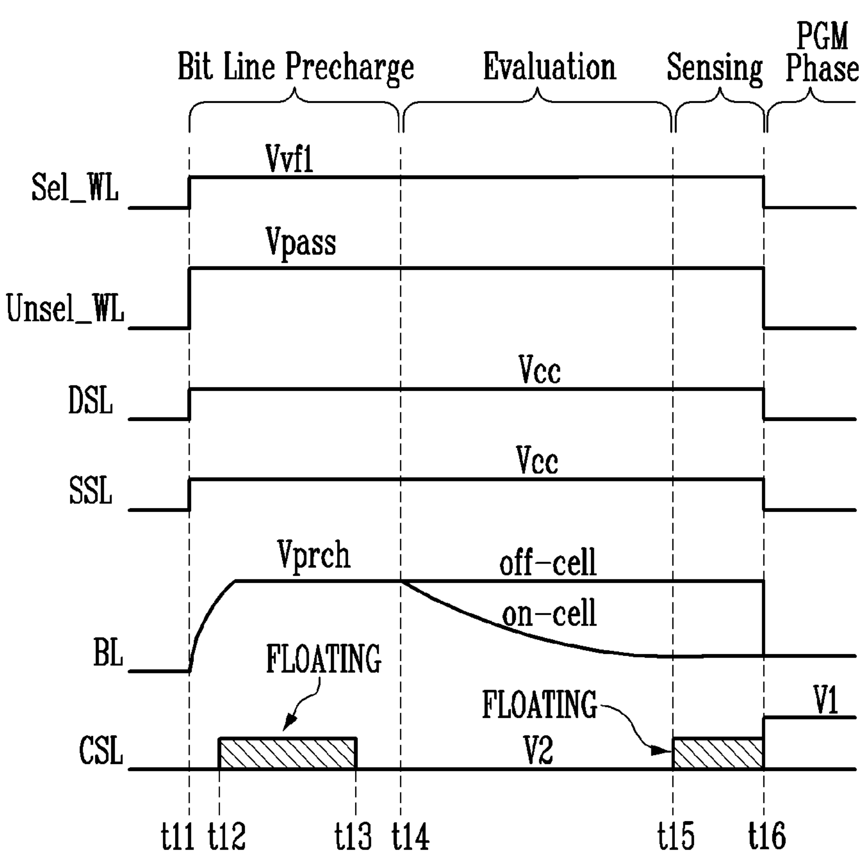
FIG. 9 is a timing diagram illustrating in detail a verify operation included in a first program loop illustrated in FIG. 8.

FIG. 9 is a timing diagram illustrating in detail a verify operation included in the first program loop illustrated in FIG. 8.

Referring to FIG. 9, the voltages of a selected word line Sel_WL, an unselected word line Unsel_WL, a drain select line DSL, a source select line SSL, a bit line BL, and a common source line CSL which are applied during a verify operation included in the first program loop are illustrated as the timing diagram. In the timing diagram of FIG. 9, an operation during a period from t11 to t15 is substantially identical to that during the period from t5 to t9 of FIG. 7. Therefore, a repeated description identical to that described with reference to FIG. 7 in the operation during the period from t11 to t15 will be omitted.

At time t15, an evaluation phase may be terminated, and the sensing phase may start. As the sensing phase is initiated, the common source line CSL may float. That is, the common source line CSL may float during the period from time t15 to time t16. Accordingly, in an embodiment, the problem in which an average current or a peak current flowing through the common source line CSL increases may be prevented or mitigated. Consequently, in an embodiment, power consumed in the read operation of the semiconductor memory device 100 may be reduced.

Referring to time t16 of FIG. 9, as the sensing phase is terminated, the first voltage V1 may be applied to the floating common source line CSL. That is, as the phase switches to the program phase of a subsequent program loop at time t16, the first voltage V1 may be applied to the floating common source line CSL. As described above with reference to FIG. 3A, the first voltage V1 may be a voltage for maintaining the channel voltage boosted in the program phase. In an embodiment, the first voltage V1 may be a supply voltage.

As illustrated in FIG. 9, in accordance with the method of operating the semiconductor memory device 100 according to an embodiment of the present disclosure, the common source line CSL may float during the verify phase of each program loop, and the first voltage V1 may be applied to the floating common source line CSL at the time of switching to the program phase of the subsequent program loop. In an embodiment, the common source line CSL may float during the verify phase of each program loop, and the first voltage V1 may be applied to the floating common source line CSL during the time at which the sensing phase transitions to a program phase of the subsequent program loop. Accordingly, in an embodiment, an operation of unnecessarily discharging the common source line CSL at a time point at which switching from the verify phase of the program operation to the subsequent program phase occurs may be prevented or mitigated. As a result, in an embodiment, the average current or peak current flowing through the common source line CSL may be decreased.

Figure 10:
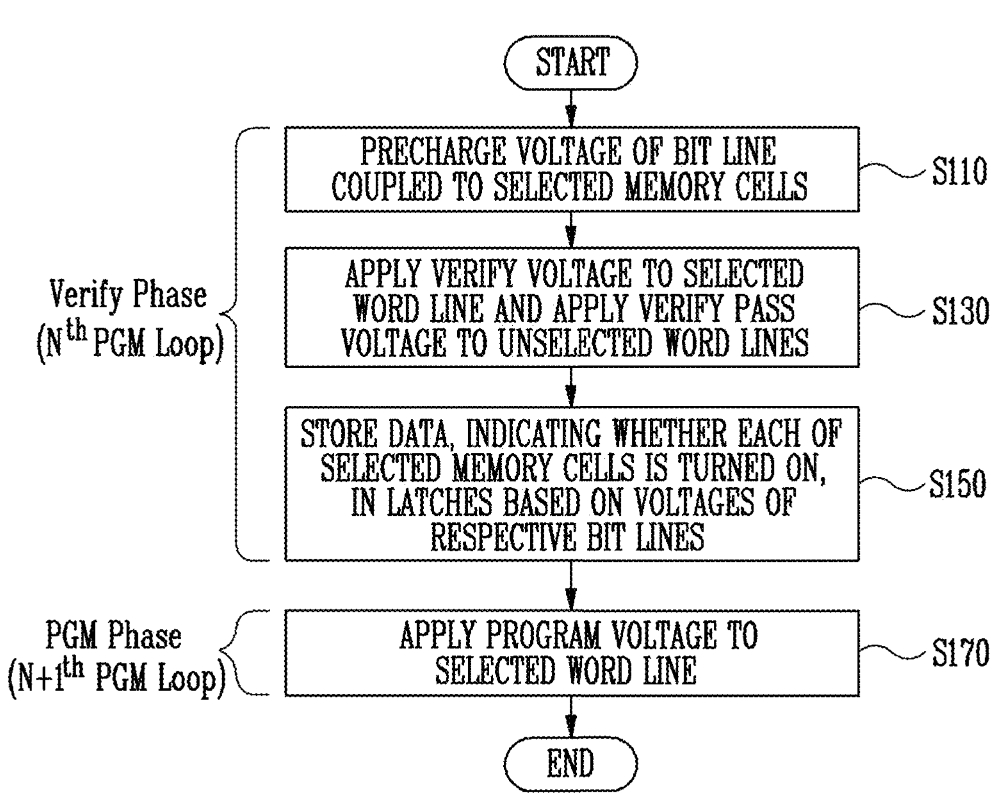
FIG. 10 is a flowchart illustrating a method of operating a semiconductor memory device according to an embodiment of the present disclosure.

FIG. 10 is a flowchart illustrating a method of operating a semiconductor memory device 100 according to an embodiment of the present disclosure. Referring to FIG. 10, an operation performed in the verify phase of an N-th program loop ($N^{th}$ PGM Loop) and an operation performed in the program phase (PGM Phases) of an N+1-th program loop ($N+1^{th}$ PGM Loop) are illustrated.

In detail, the method of operating the semiconductor memory device according to an embodiment of the present disclosure may include a plurality of program loops. Among the program loops, the verify phase of the N-th program loop ($N^{th}$ PGM Loop) may include precharging the voltage of a bit line coupled to selected memory cells at step S110, applying a verify voltage to a selected word line and applying a verify pass voltage to unselected word lines at step S130, and storing data indicating whether the selected memory cells are turned on in latches, based on the voltages of respective bit lines at step S150.

Meanwhile, the program phase (PGM Phase) of the N+1-th program loop (N+1$^{th}$ PGM Loop) may include applying a program voltage to the selected word line at step S170.

Step S110 may correspond to a bit line precharge phase. In detail, step S110 may correspond to the operation of the semiconductor memory device performed during the period from t11 to t14 of FIG. 9. That is, at step S110, the first verify voltage Vvf1 may be applied to the selected word line Sel_WL, and the pass voltage Vpass may be applied to the unselected word lines Unsel_WL. Also, at step S110, the voltage of the bit line BL may be increased through the page buffer in the state in which a drain select transistor DST and a source select transistor SST are turned on. By means of this, the voltage of the bit line BL may increase up to a precharge voltage Vprch.

In an embodiment, step S110 may include allowing the common source line CSL to float during at least a part of the period during which the voltage of the bit line increases. Referring to FIG. 9, during the period from t11 to t14, the voltage of the bit line BL increases up to a precharge voltage Vprch. During a partial period from t12 to t13 of the period from t11 to t14, the common source line CSL may float.

In an embodiment, step S110 may include applying a ground voltage to the common source line CSL during the period during which the voltage of the bit line increases. In this case, during the bit line precharge phase, the common source line CSL might not float, and the second voltage V2, for example, the ground voltage, may be applied to the common source line CSL, as in the case of the period from t1 to t2 illustrated in FIG. 4.

That is, in accordance with embodiments of the present disclosure, the common source line CSL may float, or alternatively, the second voltage V2 may be applied to the common source line CSL, during the bit line precharge period.

Step S130 may correspond to the evaluation phase. In detail, step S130 may correspond to the operation of the semiconductor memory device performed during the period from t14 to t15 of FIG. 9. That is, at step S130, the first verify voltage Vvf1 may be applied to the selected word line Sel_WL, and the pass voltage Vpass may be applied to the unselected word lines Unsel_WL. In this state, the drain select transistor DST and the source select transistor SST are turned on. As the drain select transistor DST and the source select transistor SST are turned on, the cell strings included in the selected memory block are coupled to the common source line CSL and the corresponding bit lines BL. Thereafter, the voltage of the bit line BL may be changed or maintained depending on respective threshold voltage levels of the memory cells coupled to the selected word line Sel_WL.

Among the memory cells coupled to the selected word line Sel_WL, memory cells having threshold voltages higher than the first verify voltage Vvf1 may be turned off. Accordingly, because one memory cell, among the memory cells included in the corresponding cell string, is turned off, a current path between the common source line CSL and the bit line BL may be blocked. Therefore, bit lines coupled to the turned-off cells, that is, off-cells, may be maintained at the precharge voltage Vprch.

Meanwhile, among the memory cells coupled to the selected word line Sel_WL, memory cells having threshold voltages lower than the first verify voltage Vvf1 may be turned on. Accordingly, because all of memory cells included in the corresponding cell string are turned on, a current path may be formed between the common source line CSL and the bit line BL. Therefore, the voltage of the bit line coupled to the turned-on cells, that is, on-cells, may gradually decrease.

In an embodiment, step S130 of FIG. 10 may include applying the ground voltage to the common source line CSL. As described above, in order to selectively form a current path between the bit line and the common source line CSL depending on the threshold voltages of memory cells during an evaluation period, the second voltage V2 having a relatively low level, for example, the ground voltage, may be applied to the common source line CSL during the period from t14 to t15 of FIG. 9.

Step S150 may correspond to the illustrated sensing phase. In detail, step S150 may correspond to the operation of the semiconductor memory device performed during the period from t15 to t16 of FIG. 9. At step S150, the page buffer may sense the voltages of respective bit lines, and may store the results of sensing, as bit data, in latches. Accordingly, the verify phase using the first verify voltage Vvf1 may be completed.

Step S170 may correspond to a program phase (PGM Phase) for increasing the threshold voltages of at least some of the selected memory cells. For this, at step S170, in the state in which the first voltage V1 is applied to the common source line CSL, the program pass voltage may be applied to the unselected word lines Unsel_WL, and the program voltage may be applied to the selected word line Sel_WL.

The method of operating the semiconductor memory device 100 according to the embodiment of the present disclosure is characterized in that the common source line CSL is floating. Furthermore, the method of operating the semiconductor memory device 100 according to the embodiment of the present disclosure includes applying the first voltage V1 to the floating common source line CSL during a process of switching from step S150 to step S170. Hereinafter, the method of operating the semiconductor memory device 100 according to the present disclosure will be described in detail with reference to FIGS. 11 to 13.

Figure 11:
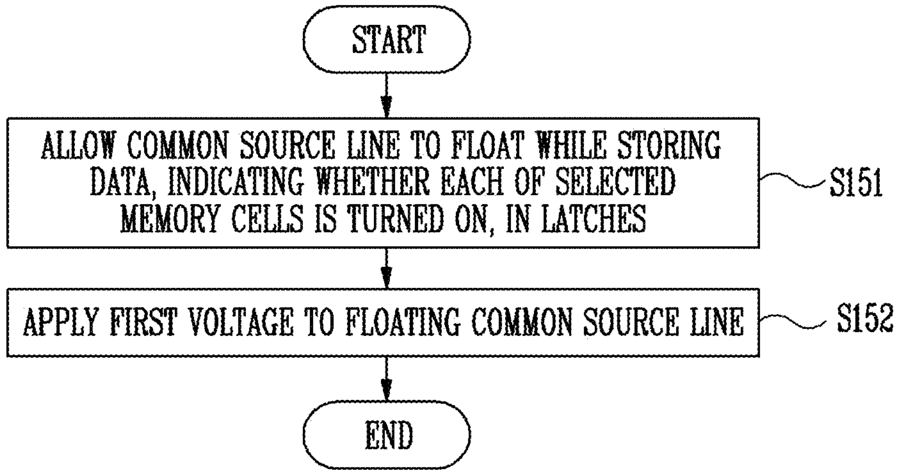
FIG. 11 is a flowchart illustrating an embodiment of step S150 of FIG. 10.

FIG. 11 is a flowchart illustrating an embodiment of step S150 of FIG. 10. Referring to FIG. 11, step S150 of FIG. 10 may include allowing the common source line CSL to float while data indicating whether each of the selected memory cells is turned on is stored in latches at step S151 and applying the first voltage to the floating common source line at step S152.

Step S151 may correspond to the sensing phase illustrated in FIG. 9. During the period from t15 to t16 of FIG. 9, a bit line sensing operation is performed. In this case, the common source line CSL may float.

When the process enters a program phase (PGM Phase) of a subsequent program loop after the sensing phase is terminated, the first voltage V1 may be applied to the floating common source line CSL at time t16. As described above, in the program phase of the subsequent program loop, in order to maintain a boosted channel voltage while the program voltage is applied to the selected word line Sel_WL, the first voltage V1 may be applied to the common source line CSL. In an embodiment, the first voltage V1 may be a supply voltage. After step S152 is performed, a program pass voltage may be applied to the unselected word lines, and a program voltage may be applied to the selected word line at step S170. Accordingly, the threshold voltages of memory cells coupled to a bit line to which a program-enable voltage is applied, among memory cells coupled to the selected word line, may increase.

The method of operating the semiconductor memory device according to the embodiment of the present disclosure may allow the common source line to float while storing data, indicating whether each of the selected memory cells is turned on, in latches in the verify phase of the program loop at step S151, and may apply the first voltage to the floating common source line CSL at step S152. That is, during the process of switching from the verify phase of the program loop to the program phase of the subsequent program loop, the first voltage V1 may be immediately applied to the floating common source line CSL instead of the floating common source line CSL being discharged to the second voltage V2. Accordingly, in an embodiment, an operation of unnecessarily discharging the common source line CSL at the time point at which switching from the verify phase of the program operation to the subsequent program phase occurs may be prevented or mitigated. Accordingly, in an embodiment, the problem in which an average current or a peak current flowing through the common source line CSL increases may be prevented or mitigated.

Referring to FIGS. 10 and 11, step S152 of applying the first voltage V1 to the floating common source line is illustrated as being included in the verify phases S110, S130, and S150 of the program operation of the semiconductor memory device. However, the present disclosure is not limited thereto. That is, in the program phase (PGM Phase) S170 of the subsequent program loop, the first voltage V1 may be applied to the floating common source line.

Figure 12:
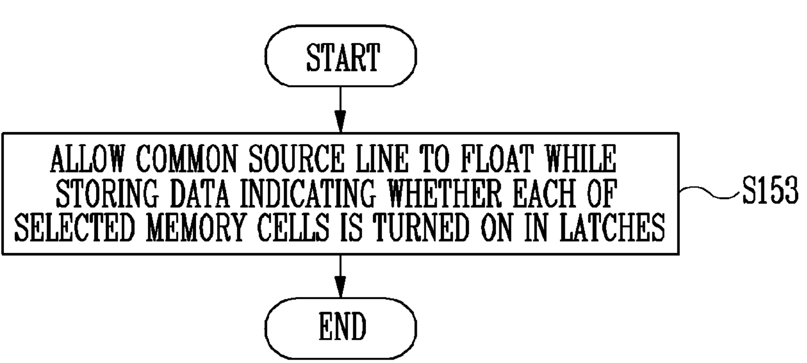
FIG. 12 is a flowchart illustrating an embodiment of step S150 of FIG. 10.
Figure 13:
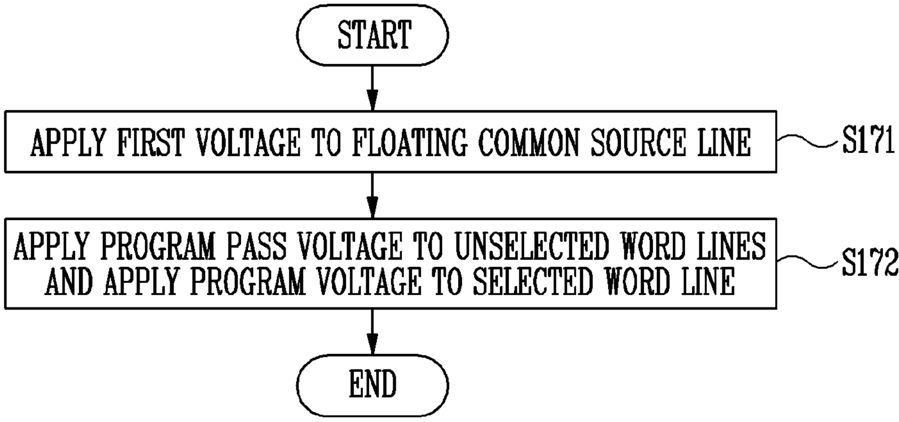
FIG. 13 is a flowchart illustrating an embodiment of step S170 of FIG. 10.

FIG. 12 is a flowchart illustrating an embodiment of step S150 of FIG. 10, and FIG. 13 is a flowchart illustrating an embodiment of step S170 of FIG. 10.

Referring to FIG. 12, step S150 of FIG. 10 may include allowing the common source line CSL to float while data, indicating whether each of the selected memory cells is turned on, is stored in latches at step S153. Apart from the embodiment illustrated in FIG. 11, in accordance with the embodiment of FIG. 12, step S150 does not include applying the first voltage V1 to the floating common source line.

Referring to FIG. 13, step S170 of FIG. 10 may include applying the first voltage V1 to the floating common source line at step S171, and applying the program pass voltage to the unselected word lines and applying the program voltage to the selected word line at step S172. Referring to FIG. 13, step S171 of applying the first voltage V1 to the floating common source line may be included in the program phase (PGM Phase) in the program operation of the semiconductor memory device.

Various embodiments of the present disclosure may provide a semiconductor device that is capable of reducing power consumption occurring during a program operation on memory cells and a method of operating the semiconductor device.

What is claimed is:

1. A semiconductor device, comprising:

a memory block including a plurality of memory cells;

a peripheral circuit configured to perform a program operation on a memory cell selected from among the plurality of memory cells; and control logic configured to control the peripheral circuit to allow a common source line coupled to the memory block to float in a sensing phase included in a verify phase of the program operation, and thereafter apply a first voltage, higher than a ground voltage, to the floating common source line.

2. The semiconductor device according to claim 1, wherein the program operation comprises a plurality of program loops, each of the plurality of program loops includes a program phase and the verify phase, and the verify phase includes a bit line precharge phase, an evaluation phase, and the sensing phase.

3. The semiconductor device according to claim 2, wherein the control logic is configured to, during a program phase included in a program loop after the verify phase, control the peripheral circuit to apply a program voltage to a selected word line coupled to the selected memory cells and apply a program pass voltage to an unselected word line coupled to unselected memory cells in a state in which the first voltage is applied to the common source line.

4. The semiconductor device according to claim 3, wherein the first voltage is a voltage for maintaining a boosted channel voltage of the selected memory cells while the program voltage is applied to the selected word line.

5. The semiconductor device according to claim 1, wherein the first voltage is a supply voltage.

6. The semiconductor device according to claim 2, wherein the control logic is configured to control the peripheral circuit to increase voltages of a plurality of bit lines to a preset precharge voltage and apply a turn-on voltage to a drain select line and a source select line that are coupled to the memory block in the bit line precharge phase.

7. The semiconductor device according to claim 2, wherein the control logic is configured to control the peripheral circuit to apply a read voltage to a selected word line coupled to the selected memory cells and apply a pass voltage to an unselected word line in the evaluation phase.

8. The semiconductor device according to claim 2, wherein the control logic is configured to control the peripheral circuit to apply a second voltage, lower than the first voltage, to the common source line in the evaluation phase.

9. The semiconductor device according to claim 2, wherein the control logic is configured to control the peripheral circuit to store data, indicating whether each of the selected memory cells is turned on, in a latch in the sensing phase.

10. The semiconductor device according to claim 2, wherein the control logic is configured to control the peripheral circuit to allow the common source line to float during at least a part of a period in which voltages of a plurality of bit lines coupled to the memory block are increased in the bit line precharge phase.

11. The semiconductor device according to claim 2, wherein the control logic is configured to control the peripheral circuit to apply a second voltage, lower than the first voltage, to the common source line in the bit line precharge phase.

12. A method of operating a semiconductor device, comprising:

precharging voltages of bit lines coupled to a memory block including memory cells selected as a program target, among a plurality of memory cells;

applying a verify voltage to a selected word line coupled to the selected memory cells, among word lines coupled to the memory block, and applying a verify pass voltage to an unselected word line other than the selected word line, among the word lines; and storing data, indicating whether each of the selected memory cells is turned on, in a latch based on respective voltages of the bit lines, wherein storing the data, indicating whether each of the selected memory cells is turned on, in the latch comprises:

allowing a common source line coupled to the memory block to float;

and thereafter applying a first voltage, higher than a ground voltage, to the floating common source line.

13. The method according to claim 12, further comprising:

after storing the data, indicating whether each of the selected memory cells is turned on, in the latch, applying a program pass voltage to the unselected word line and applying a program voltage to the selected word line.

14. The method according to claim 12, wherein precharging the voltages of the bit lines comprises:

increasing the voltages of the bit lines to a preset precharge voltage and applying a turn-on voltage to a drain select line and a source select line that are coupled to the memory block.

15. The method according to claim 12, wherein applying the verify voltage to the selected word line and applying the verify pass voltage to the unselected word line comprises:

applying a second voltage, lower than the first voltage, to the common source line.

16. The method according to claim 12, wherein precharging the voltages of the bit lines comprises:

allowing the common source line to float during at least a part of a period during which the voltages of the bit lines are increased.

17. The method according to claim 12, wherein precharging the voltages of the bit lines comprises:

applying a second voltage, lower than the first voltage, to the common source line.

18. A method of operating a semiconductor device, comprising:

precharging voltages of bit lines coupled to a memory block including memory cells selected as a program target, among a plurality of memory cells;

applying a verify voltage to a selected word line coupled to the selected memory cells, among word lines coupled to the memory block, and apply a verify pass voltage to an unselected word line other than the selected word line, among the word lines;

storing data, indicating whether each of the selected memory cells is turned on, in a latch based on respective voltages of the bit lines; and applying a program pass voltage to the unselected word line and applying a program voltage to the selected word line, wherein storing the data, indicating whether each of the selected memory cells is turned on, in the latch comprises:

allowing a common source line coupled to the memory block to float, and wherein applying the program pass voltage to the unselected word line and applying the program voltage to the selected word line comprises:

applying a first voltage, higher than a ground voltage, to the floating common source line.

19. The method according to claim 18, wherein precharging the voltages of the bit lines comprises:

increasing the voltages of the bit lines to a preset precharge voltage and applying a turn-on voltage to a drain select line and a source select line that are coupled to the memory block.

20. The method according to claim 18, wherein applying the verify voltage to the selected word line and applying the verify pass voltage to the unselected word line comprises:

applying a second voltage, lower than the first voltage, to the common source line.

21. The method according to claim 18, wherein precharging the voltages of the bit lines comprises:

allowing the common source line to float during at least a part of a period during which the voltages of the bit lines are increased.

22. The method according to claim 18, wherein precharging the voltages of the bit lines comprises:

applying a second voltage, lower than the first voltage, to the common source line.

* * * * *